United States Patent [19]

Tong et al.

[11] Patent Number: 4,926,169
[45] Date of Patent: May 15, 1990

[54] CODER-DECODER FOR PURGED EXTENDED GOLAY (22,7) CODES

[75] Inventors: Po Tong, Alameda; Elwyn R. Berlekamp, Piedmont, both of Calif.; Robert J. Currie, Salt Lake City; Craig K. Rushforth, Kaysville, both of Utah

[73] Assignee: UNISYS Corp., Blue Bell, Pa.

[21] Appl. No.: 276,757

[22] Filed: Nov. 28, 1988

[51] Int. Cl.$^5$ .................. H04Q 9/00; G07F 11/12
[52] U.S. Cl. .................. 340/825.57; 341/173; 371/37.1
[58] Field of Search .................. 340/825.57; 371/2, 37, 371/47, 5, 41, 71, 94; 370/102, 29, 94.1, 94.2; 375/26, 106, 94; 341/173

[56] References Cited

U.S. PATENT DOCUMENTS 4,397,022 8/1983 Weng et al. .................. 371/37
4,414,667 11/1983 Bennett .................. 371/37
4,613,860 9/1986 Currie et al. .................. 340/825.57

OTHER PUBLICATIONS

Clark et al., Error-Correction Coding for Digial Communications, 8/1982, Section 2.2.8.

Primary Examiner—Donald J. Yusko
Assistant Examiner—Eric Oliver Pudpud
Attorney, Agent, or Firm—John B. Sowell; Mark T. Starr; Robert S. Bramson

[57] ABSTRACT

Transmitting and receiving apparatus for transmitting data which includes a purged extended Golay (22,7) code encoder at the transmitter for encoding digital data into constant weight unbalanced codewords representative of the digital data. The constant weight unbalanced codewords contain error correction bits and are preferably transmitted as balanced codewords. When the receiver decodes the original digital data, improved tracking and acquisition of the transmitted data is achieved.

9 Claims, 2 Drawing Sheets

CODER-DECODER FOR PURGED EXTENDED GOLAY (22,7) CODES

BACKGROUND OF THE INVENTION

This application is related to and is an improvement of our U.S. Pat. No. 4,613,860 issued 23 Sept. 1986 entitled Coder-Decoder For Purged Binary Block Codes and is incorporated by reference herein.

FIELD OF THE INVENTION

The present invention relates to an improved encoder employing a novel code which optimizes the imbalance of ones and zeros in the codewords and thereby provides an improved residual carrier for acquisition and tracking.

DESCRIPTION OF THE PRIOR ART

The above-referenced U.S. Pat. No. 4,613,860 includes a purged code encoder at the transmitter for encoding digital data signals into constant-weight codewords with an imbalance of zeros and ones.

In our above-referenced patent it was determined that the purged extended Golay (24,8) code employed in the encoder was determined to have an imbalance in which the ratio of the carrier component to the total signal energy was minus 9.5 db.

It would be desirable to improve the imbalance by employing a purged extended Golay (22,7) code encoder and thereby enhance the acquisition and tracking characteristics of the transmitted signal.

SUMMARY OF THE INVENTION

It is a principal object of the present invention to provide an encoding system for encoding a balanced data stream into an improved unbalanced coded form which enhances acquisition and tracking at the receiver.

It is another object of the present invention to provide a purged extended Golay (22,7) code encoding and decoding system.

It is another object of the present invention to provide an encoder for encoding data signals into codewords containing 7 ones and 15 zeros for a length of 22.

It is another object of the present invention to provide a residual carrier which is enhanced approximately 0.75 db relative to prior art encoded signal systems.

According to these and other objects of the present invention, there is provided in a transmitting and receiving apparatus a purged extended Golay (22,7) code encoder which is coupled to an input data stream for altering the data stream to provide an improved unbalanced coded format. Further, there is provided in the receiver a purged extended Golay (22,7) code decoder which recovers the original data in the unbalanced data stream and also provides error correction and detection.

DESCRIPTION OF THE PREFERRED EMBODIMENT

Figure 1:
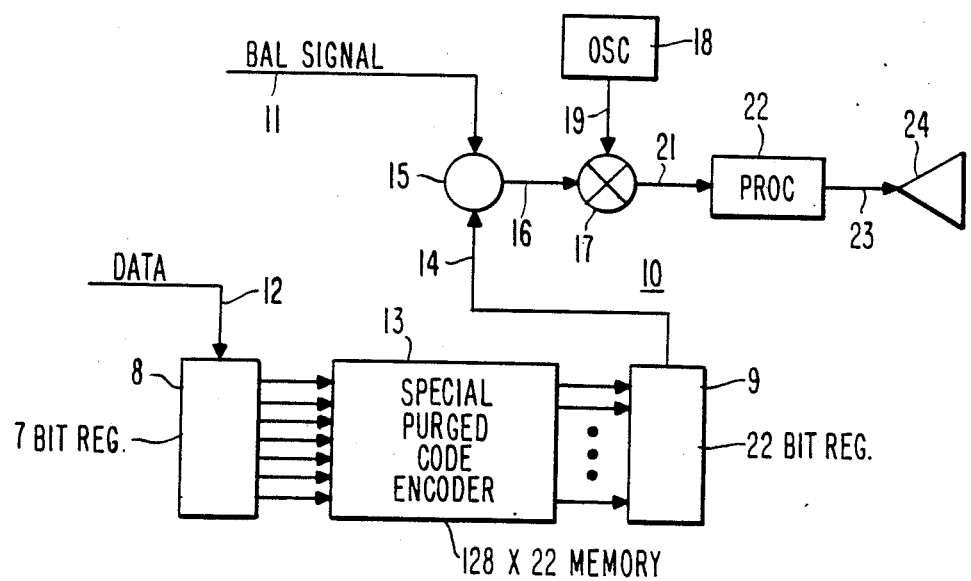
FIG. 1 is a logic block diagram of a portion of a transmitter showing the preparation of the novel coded data signals processed for transmission.

Refer now to FIG. 1 showing in logic block diagram form a portion of a transmitter 10 employed to transmit the special purged Golay codewords. A balanced code signal, such as a pseudonoise spread spectrum signal, is applied on line 11 in serial format. The balanced data signal to be encoded is applied on line 12 in original serial digital format or after being converted to digital format. The serial data signals on line 12 are converted to parallel format in series-to-parallel seven-bit register 8 and are then applied as a parallel input to purged extended Golay (22,7) encoder 13. In the preferred embodiment of the present invention, encoder 13 may be implemented as a 128 by 22-bit ROM memory. The output of encoder 13 is applied as a 22-bit unbalanced parallel input to parallel-to-serial register 9. The serial balanced data on input line 12 is converted to a predetermined unbalanced parallel form at the input to register 9 and is then converted back to serial unbalanced data at the output of register 9 on line 14.

The serial unbalanced data on line 14 and the balanced code signal on line 11 are combined in combining means 15 which may be implemented as a modulo-two adder or a conventional mixer. The combined output from combining means 15 is applied as a balanced-code-set signal input to mixer 17. Carrier frequency oscillator 18 produces a carrier signal on line 19 which is applied to mixer 17 to produce a balanced modulated carrier signal on output line 21. The modulated carrier signal on line 21 is applied to signal processor 22 before being applied via line 23 to the antenna 24 of transmitting system 10.

Figure 2:
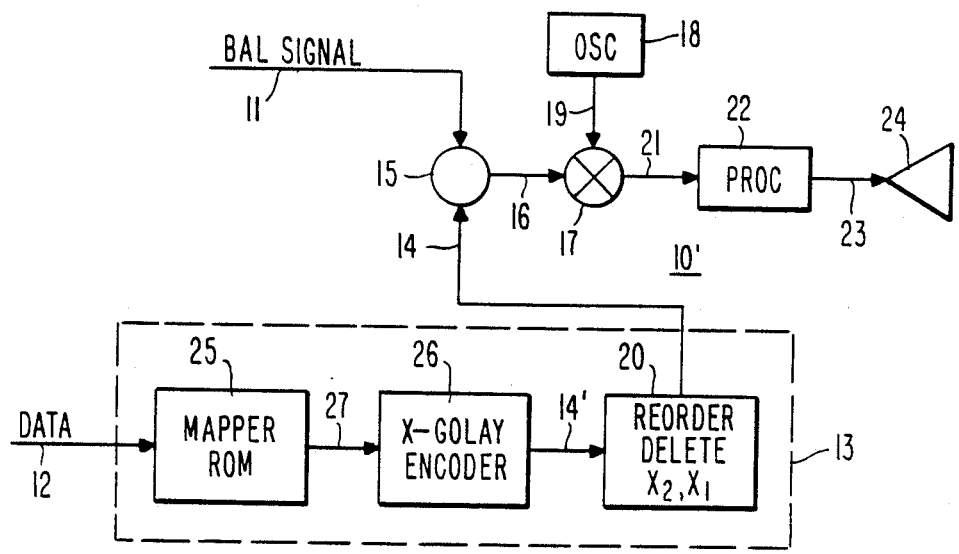
FIG. 2 is a modified logic block diagram of the transmitter of FIG. 1 showing an alternative purged code encoder for preparing the novel coded data signals for transmission.

Refer now to FIG. 2 showing a modified form of transmitter 10 of FIG. 1. Transmitter 10' is shown having a purged code encoder 13 inside of phantom lines comprising a mapper ROM 25, an extended Golay code encoder 26 and reorder and delete mapper logic 20. The balanced data signals on line 14 are combined in combining means 15 to provide the balanced-code-set signals on line 16 as was explained hereinbefore with regards to FIG. 1. The balanced-code-set signals on line 16 are processed and transmitted by elements 17 to 24 as was previously explained.

As an example of a preferred operation of the structure 13 shown in FIG. 2, assume that seven parallel data bits are being presented in blocks on line 12 and are applied to mapper ROM 25. In a preferred embodiment, mapper ROM 25 is a 128×12-bit ROM which generates twelve parallel information bits on output line 27. The twelve information bits are applied to an extended Golay encoder 26 to produce a codeword twenty-four bits long on line 14. The codeword on line 14' is uniquely defined by the seven bits of original data information. The twenty-four bit codewords on line 14' are applied to reorder and delete logic block 20 to produce the novel purged extended Golay (22,7) codeword on output line 14 in serial format. The serial purged extended codeword on output line 14 is the same codeword as produced on output line 14 of FIG. 1. This codeword is applied to combining means 15 to provide the balanced-code-set signals on line 16 as was explained hereinbefore when a balanced spread spectrum code signal was applied on line 11.

The transmitters 10 and 10' of FIGS. 1 and 2 may be operated in a non-spread spectrum mode of operation as well as in the aforementioned spread spectrum mode of operation. In the non-spread spectrum mode of operation, the balanced code signals on line 11 are omitted or turned off as an input to combining means 15. With no spread spectrum coded signals present on line 11, combining means 15 produces an unbalanced code signal on line 16 that is identical to the unbalanced signal on line 14.

Figure 3:
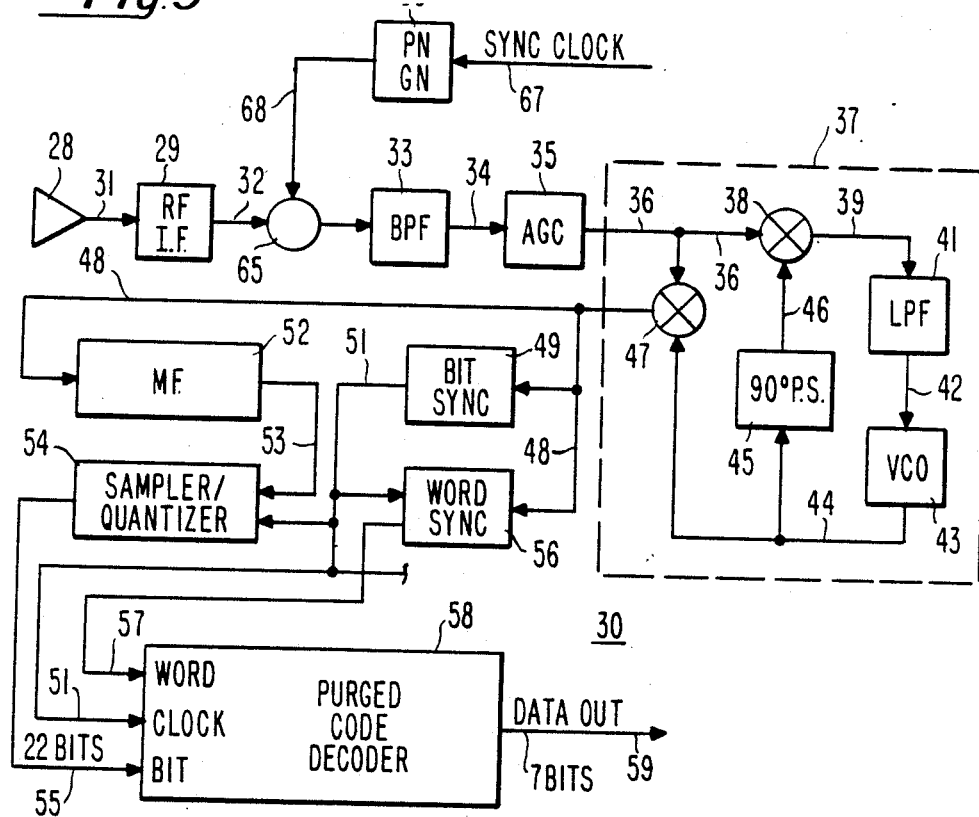
FIG. 3 is a simplified logic block diagram of a modified and improved prior art receiver for receiving spread-spectrum coded signals and for detecting the novel coded data bits transmitted from the transmitting apparatus.

Refer now to FIG. 3 showing a simplified logic block diagram of a receiver for receiving the aforementioned non-spread spectrum coded signal. In a non-jamming environment, the non-spread spectrum receiver 30 receives the unbalanced code signal transmitted from antenna 24. The aforementioned unbalanced code signal is received at antenna 28 and applied to the radio frequency-to-intermediate frequency down converter 29 via line 31. The intermediate frequency signal on line 32 is applied to bandpass filter 33 to provide a noise limited intermediate frequency signal on line 34. The variable amplitude signal on line 34 is controlled to a fixed amplitude in automatic gain controller 35. The fixed amplitude signal on line 36 is applied to the carrier tracking loop 37 which comprises a mixer 38. The output from mixer 38 on line 39 is applied to the lowpass filter 41 to produce an output on line 42 which is applied to the voltage controlled oscillator 43. The output from voltage controlled oscillator 43 on line 44 is first applied to the ninety degree phase shifter 45 to provide an output on line 46 which is applied to the mixer 38. The application of the phase shifted signal on line 46 to mixer 38 provides quadrature tracking of the signal on line 36. When the carrier tracking loop 37 is properly tracking, the signal on line 44 is in absolute phase synchronism with the signal on line 36. Accordingly, when the signals on line 36 and 44 are applied to the coherent detector 47, there is provided an output signal on line 48 which is coherently reduced to a baseband signal. The coherent detector 47 effectively removes the intermediate frequency carrier from the unbalanced code signal on line 36, leaving an unbalanced signal at baseband. An analog output signal is produced on line 48 which is applied to a bit synchronizer 49 to provide a data clock signal as an output on line 51.

When the transmitter 10 or 10' in FIGS. 1 and 2 employs a pseudonoise-generated balanced signal on line 11 which is mixed with the unbalanced signal on line 14, a balanced signal is produced on line 16 and transmitted from the antenna 24. When this signal is received at antenna 28, the signal on line 31 is translated in frequency by converter 29 and the signal on line 32 is demodulated by mixer 65 before being applied to band pass filter 33. Pseudonoise generator 66 is synchronized with the incoming pseudonoise (P.N.) generated balanced signal from the transmitter by a clock signal on line 67. This clock signal is capable of tracking the incoming signal and applying the P.N. signal on line 68 to mixer 65, thereby removing the P.N. component of the signal and leaving an unbalanced signal which is applied to filter 33. It will be understood that mixer 65 and P.N. generator 66 are not employed when the received signal is unbalanced and has no P.N. component. The present transmitting and receiving system is capable of improved operation whether or not balanced signals are being transmitted by transmitters 10 and 10'.

The analog output signal on line 48 may be detected by matched filter 52. The detected signal on line 53 is still an analog signal which is applied to sampler-quantizer 54 along with the clock signal on line 51. The clock signal on line 51 is also applied to word synchronizer 56 which produces an output signal on line 57 indicative of the start and finish of the aforementioned twenty-two bit codeword. The three input lines 51, 55 and 57 are applied to purged code decoder 58. It will be understood that the information from sampler-quantizer 54 on line 55 is in the form of a one or zero when there is a hard decision being provided to decoder 58. When a soft decision is being provided to the decoder 58, a plurality of lines 55 are employed to supply the soft decision information.

The purged code decoder 58 may be constructed of a bank of 128 matched filters, one for each codeword in the code. The output from the purged code decoder 58 is provided on line 59. The data output on line 59 may be described as the best estimate of the data word on line 12.

If the analog signal on line 48 were applied directly to purged code decoder 58 comprising one hundred twenty-eight matched filters, the result on data output line 59 would be a maximum likelihood estimate of the data which was originally transmitted.

The purged code decoder 58 may be simplified with only a small degradation in the performance of the output. For example, the analog signal on line 48 may be digitized as previously described before being applied to the purged code decoder 58. The larger the number of levels employed in the sampler-quantizer 54, the smaller will be the amount of degradation in performance.

Figure 4:
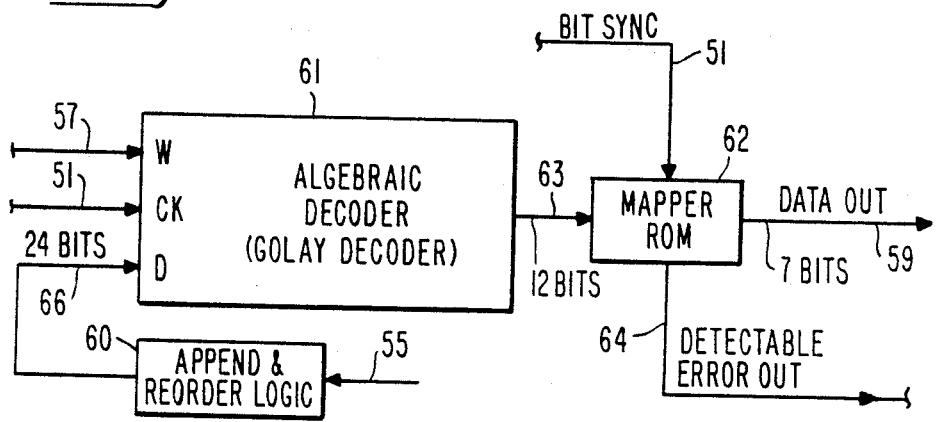
FIG. 4 is a logic block diagram circuit of another modified prior art purged code decoder which is modified for detecting the novel coded data bits transmitted from the transmitting apparatus and for generating detectable error signal outputs.

Refer now to FIG. 4 showing a modified form of the purged code decoder 58 consisting of an append-and-reorder logic circuit 60, an algebraic Golay decoder 61, and a mapper ROM. The sampler/quantizer 54 produces hard decision (i.e., binary) estimates of the received symbols on line 55. Append-and-reorder logic 60 assembles a twenty-two symbol estimate of a codeword from the purged code. The leading "01" which was previously deleted by special encoder 13 in FIG. 1, or by reorder-and-delete logic 20 in FIG. 2, is appended to the twenty-two symbol assembled word. Logic 65 then performs the reverse of the reordering performed to obtain the (22,7) code. The result is an estimate of a codeword from the XGolay(24,12) code. This resulting codeword appears on line 66 and is decoded by decoder 61. The output of decoder 61 on line 63 is a twelve-bit word corresponding to data bits which would have generated the codeword of the XGolay(24,12) closest to the estimate of the codeword that appeared on line 66. The twelve-bit word on line 63 represents one of the 4096 codewords in the Golay(24,12) code. Mapper ROM 62 maps the twelve-bit word on line 63 to the appropriate seven-bit word used to generate the codeword of the (22,7) code on line 59. Mapper ROM 62 is preferably a 4096 by 7-bit look-up table.

An alternative mapping would generate an error signal when the output of decoder 61 indicates a codeword not in the (22,7) code. This would require the mapper ROM 62 be a 4096 by 8-bit look-up table, since all possible combinations of seven bits are needed to identify the 128 codewords of the (22,7) code.

In the preferred embodiment shown in FIG. 1, a special purged code encoder 13 was employed. The purged coder encoder may be made from a ROM used as a look-up table. Assume that the seven bits of binary data on line 12 are mapped into twenty-two bit codewords on line 14 as follows:

| No. | 7 Binary Data Bits | 22 Bit codewords |
|---|---|---|
| 0 | 0 000 000 | 11000 10010 00010 00011 00 |
| 1 | 0 000 001 | 10101 00011 01000 00010 00 |
| 2 | 0 000 010 | 00101 10110 00010 00100 00 |
| 3 | 0 000 011 | 01000 00111 01000 00101 00 |
| 4–22 | | |
| 23 | 0 010 111 | 10000 00011 00010 01100 10 |
| 24–46 | | |
| 47 | 0 101 111 | 00100 00011 00011 00001 01 |
| 48–50 | | |
| 51 | 0 110 011 | 00011 11110 00001 00000 10 |

The above bits and codewords are a small portion of the special (22,7) purged Golay code which is derived from the full Golay (24,12) code consisting of $2^{12}$ codewords. The codewords above have a constant weight of seven while maintaining acceptable error-correction capability.

The above-illustrated codewords are shown to be twenty-two bits in length and were derived from a preselected set of the aforementioned twenty-four bits Golay codewords, each starting with "01". When the "01" highest order binary digits are dropped, only twenty-two bits remain.

It is possible to generate the codewords of a full Golay (24,12) code set from the following generator matrix:

COLUMN POSITIONS 0-23

| | | 0 1 2 3 4 5 6 7 8 9 10 11 | 12 13 14 15 16 17 18 19 20 21 22 | 23 |
|---|---|---|---|---|
| ROWS 0-11 | 0 | 1 | 1 0 1 0 1 1 1 0 0 0 1 | 1 |
| | 1 | 1 | 1 1 1 1 1 0 0 1 0 0 1 | 0 |
| | 2 | 1    All 0's | 1 1 0 1 0 0 1 0 1 0 1 | 1 |
| | 3 | 1 | 1 1 0 0 0 1 1 1 0 1 1 | 0 |
| | 4 | 1 | 1 1 0 0 1 1 0 1 1 0 0 | 1 |
| | 5 | 1 | 0 1 1 0 0 1 1 0 1 1 0 | 1 |
| | 6 | 1 | 0 0 1 1 0 0 1 1 0 1 1 | 1 |
| | 7 | 1 | 1 0 1 1 0 1 1 1 1 0 0 | 0 |
| | 8 | All 0's 1 | 0 1 0 1 1 0 1 1 1 1 0 | 0 |
| | 9 | 1 | 0 0 1 0 1 1 0 1 1 1 1 | 0 |
| | 10 | 1 | 1 0 1 1 1 0 0 0 1 1 0 | 1 |
| | 11 | 1 | 0 1 0 1 1 1 0 0 0 1 1 | 1 |

When every possible combination of the twelve rows 0-11 of twenty-four columns 0-23 of bits shown are added together, there will be 4096 separate and distinct twenty-four bit codewords.

The above generator matrix does not have the vertical columns in the proper sequence in order to generate the special purged Golay (22,7) code described herein for encoding and decoding the seven bits of digital data. The columns of this matrix are reordered to provide a 24×12 matrix suitable for generating the special (22,7) code as follows:

REORDERED COLUMN POSITIONS 0-23

| | 0 12 14 16 17 18 22 23 | 8 9 10 11 | 1 13 2 15 3 5 6 19 20 21 7 | 8 |
|---|---|---|---|---|
| 0 | 1 1 1 1 1 1 1 1 | 0 0 0 0 | 0 0 0 0 0 0 0 0 0 0 0 | 0 |
| 1 | 0 1 1 1 0 0 1 0 | 0 0 0 0 | 1 1 0 1 0 0 0 1 0 0 0 | 0 |
| 2 | 0 1 0 0 0 1 1 1 | 0 0 0 0 | 0 1 1 1 0 0 0 0 1 0 0 | 0 |
| 3 | 0 1 0 0 0 1 1 1 | 0 0 0 0 | 0 1 0 0 1 0 0 1 0 1 0 | 0 |
| 4 | 0 1 0 1 1 0 0 1 | 0 0 0 0 | 0 1 0 0 0 1 0 1 1 0 0 | 0 |
| 5 | 0 0 1 0 1 1 0 1 | 0 0 0 0 | 0 1 0 0 0 0 1 0 1 1 0 | 0 |
| 6 | 0 0 1 0 0 1 1 1 | 0 0 0 0 | 0 0 0 1 0 0 0 1 0 1 1 | 0 |
| 7 | 0 1 1 0 1 1 0 0 | 0 0 0 0 | 0 0 0 1 0 0 0 1 1 0 0 | 1 |
| 8 | 0 0 0 1 0 1 0 0 | 1 0 0 0 | 0 1 0 1 0 0 0 1 1 1 0 | 1 |
| 9 | 0 0 1 1 1 0 1 0 | 0 1 0 0 | 0 0 0 0 0 0 0 1 1 1 0 | 0 |
| 10 | 0 1 1 1 0 0 0 1 | 0 0 1 0 | 0 0 0 0 1 0 0 0 1 1 0 | 0 |
| 11 | 0 0 0 1 1 0 1 1 | 0 0 0 1 | 0 1 0 1 0 0 0 0 0 1 0 | 0 |
| | 0 1 2 3 4 5 6 7 | 8 9 10 11 | 12 13 14 15 16 17 18 19 20 21 22 | 23 |

NEW COLUMN POSITIONS 0-23

When the above column-reordered generator matrix is employed to generate a full set of 4096 codewords, one of which is all zeros, the following rules are applied to reduce the 4096 codewords to a unique set of 128 codewords representative of the novel (22,7) purged code as follows:

1. Select those 1024 of the 4096 codewords which start with "01". Stated differently, if the codeword or vector is $C.W. = X_0 X_1 X_2 X_3 \text{---} X_{23}$, then select the codewords wherein $X_0 = 0$ and $X_1 = 1$.

2. Of these 1024 codewords, select those having a weight of 8. Thus, the selected codewords all have eight ones and sixteen zeros.

3. From this set of weight-8 codewords which start with $X_0 X_1 X_2 X_3 X_4 = 01000$, select only those codewords where $X_5 X_6 X_7 = 111$. Stated differently, if the codeword is to be retained and starts with 01000 etc., it must also start with 01000111.

There now remain 128 codewords, twenty-four bits long, all of which start with 01.

4. Eliminate the 01 at the beginning of each codeword. The 128 remaining codewords form a unique set of codewords which have a weight of seven (7), while retaining the desired minimum distance of 8. These codewords may be placed in the aforementioned ROM 13 to provide a 128×22-bit memory. The mapping of the data into codewords is not unique; thus, the twenty-two bit codewords may be stored in memory 13 in any desirable order. Once the codewords are stored in a desired order, both the transmitter and receiver must employ the same order or sequence of codewords for proper operation.

In the preferred embodiment encoders and decoders employed in the present invention, only one hundred twenty-eight codewords of the full 4096 codewords are chosen for use; thus, the Golay (22,7) code is contracted or *purged*. It will be understood that those skilled in the art of selecting purged Golay codes or extended (X) Golay codes may select sets of codewords designed to improve different performance characteristics which may be inconsistent with each other.

A desirable characteristic, achieved by selecting proper purged codes, is to optimize the imbalance which will result in improved tracking.

The present invention code employed in the encoder provides an imbalance in which the carrier ratio of the power to the total signal power is 8.75 db for an improvement of 0.75 db over our previous patent.

Having explained that a set of Golay codewords may be selected to enhance a desirable characteristic, it will now be understood that twenty-two bit extended Golay codewords may be written into the memory look-up table 13 shown in FIG. 1. The seven-bit data words on line 12 are thus capable of producing the extended twenty-two bit Golay codewords on line 14 which yield improved tracking performance while retaining error-correction capability.

In the modified embodiment shown in FIG. 2, the seven-bit data vector is applied to encoder 13 on line 12. Mapper ROM 25 maps the seven-bit vector to the appropriate twelve-bit data vector necessary for the XGolay encoder 26 to generate the corresponding twenty-four bit codeword of the (24,12) code. The twenty-four bit codeword on line 14' is applied to the reorder-and-delete logic 20 which coverts the twenty-four bit code to a twenty-two bit codeword from the (22,7) code as described previously.

The present invention subset was selected from an extended Golay (24,12) code and is a purged code having only 128 unbalanced codewords of twenty-two bits each. The codewords have a weight of seven and an average distance structure of: one word at a distance of zero, 48.75 codewords at a distance of eight, and 78.75 codewords at a distance of twelve.

The twenty-two bit codewords which are being applied to the purged code decoders shown in FIGS. 3 and 4 will permit recovery of the original seven data bits as an output on line 59.

When algebraic decoder 61 is employed, the output on line 63 is a twelve-bit word containing the information bits described hereinbefore. The twelve information bits on line 63 may be applied to the look-up table 62 to provide the original seven data bits entered on line 12. Extended Golay decoders may be obtained which will accept either hard or soft decision representations of the received words on line 55. Thus, the aforementioned algebraic decoder 61 may be replaced with a soft decision decoder.

The imbalance of the extended purged Golay (22,7) code is expressed as a ratio of ones to zeros; thus, when each codeword of 22 bits in length has seven (7) data or information bits, the ratio of ones to zeros is seven (7) to fifteen (15) or 7/15. This predictable imbalance ratio is an improvement over prior art Golay coders and decoders.

What we claim is:

1. Encoding system, having a transmitting apparatus and a receiving apparatus, comprising:
    means for generating balanced-code-set signals,
    means for generating digital data signals,
    a purged code encoder coupled to said digital data signals for generating a purged extended Golay (22,7) code,
    said encoder being adapted to generate 128 unbalanced codewords in a modified subset of the Golay (24,12) code,
    said subset of codewords all having a length of 22 bits, a weight of 7 and a minimum distance of 8,
    means for combining said balanced-code-set signals and said unbalanced codewords to provide balanced digital signals defining said data signals and containing error correction bits for transmission,
    transmitting means,
    means for receiving said balanced digital signals containing error correction bits,
    detector means comprising carrier tracking loop means connected to said receiving means for tracking said received signals,
    said detector means adapted to remove said balanced-code-set signals and for recovering said unbalanced codewords and having bit synchronization signal means, word synchronization signal means and means for producing quantized data signals, and
    purged code decoder means coupled to said bit synchronization signal means, said word synchronization signal means and said quantized data signals for producing a best estimate of said data signals as an output.

2. Encoding system as set forth in claim 1 wherein said purged code encoder comprises a set of 128 unbalanced codewords having twenty-two bits each, a weight of seven and an average distance structure of: one word at a distance of zero, 78.75 words at a distance of eight and 48.25 words at a distance of twelve.

3. Encoding system as set forth in claim 1 wherein said imbalance of said purged extended Golay (22,7) codewords has seven ones to fifteen zeros.

4. Encoding system as set forth in claim 3 wherein said imbalance ratio of said purged extended Golay (22,7) code provides an enhanced acquisition and tracking characteristic in which the ratio of the carrier power to the total power is $-8.75$ db.

5. Encoding system as set forth in claim 3 wherein the residual carrier present in the carrier tracking loop means is enhanced by 0.75 db relative to that for the purged extended Golay (24,8) code.

6. Encoding system comprising:
    means for generating a serial stream of digital data signals to be transmitted,
    block formatting means for converting streams of seven information bits of digital data signals into parallel format blocks,
    a purged extended Golay (22,7) code encoder coupled to said block formatting means for expanding and encoding said blocks of seven information bits into codewords of a modified subset of the Golay (24,12) code,
    said modified subset of codewords providing 128 unique unbalanced codewords each having a length of 22 bits, a weight of 7 and 15 zero bits each having a minimum Hamming distance of 8, carrier signal generation means coupled to the output of said Golay (22,7) code encoder for providing data modulated carrier signals, transmitting means coupled to said data modulated carrier signals, means for receiving said data modulated signals, detector means coupled to said receiver means comprising carrier tracking loop means for tracking said received signals and bit resynchronization signal means for producing clock synchronized bit and codeword data signals, and purged code decoder means coupled to said bit and codeword data signals for producing output data words corresponding to the blocks of seven information bits of digital data encoded into said codewords.

7. Encoding system as set forth in claim 6 which further comprises, mixer means coupled between the output of said purged extended Golay (22,7) code encoder and said carrier signal generation means.

8. Encoding system as set forth in claim 7 which further includes:

balanced signal input means coupled to said mixer means for producing balanced digital signals defining said unbalanced codewords.

9. Encoding system as set forth in claim 6 wherein the imbalance of zeros to ones is 15 to 7 or a ratio of 2.1429 which is proportional to the residual carrier produced in the carrier tracking loop and comprises an enhancement of 0.75 db relative to a transmitted purged extended Golay (24,8) code codewords.

* * * * *